US011751356B2

(12) United States Patent
Gao

(10) Patent No.: US 11,751,356 B2
(45) Date of Patent: Sep. 5, 2023

(54) RACK BACKUP ENERGY UNIT WITH ADVANCED THERMAL MANAGEMENT SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 108 days.

(21) Appl. No.: 17/484,301

(22) Filed: Sep. 24, 2021

(65) Prior Publication Data

US 2023/0098147 A1   Mar. 30, 2023

(51) Int. Cl.
*H05K 7/20* (2006.01)

(52) U.S. Cl.
CPC ..... *H05K 7/20327* (2013.01); *H05K 7/20309* (2013.01); *H05K 7/20318* (2013.01)

(58) Field of Classification Search
CPC ........... H05K 7/20809; H05K 7/20272; H05K 7/20327; H05K 7/20318; H05K 7/203; H05K 7/20236; H05K 7/1492; H05K 7/208; H05K 7/20818; H05K 7/20281; H05K 7/20881; G06F 1/20; G06F 1/189; G06F 1/3212; H01M 10/613; H01M 10/6568; H01M 50/204

USPC .......................................................... 361/699
See application file for complete search history.

(56) References Cited

U.S. PATENT DOCUMENTS

| | | | |
|---|---|---|---|
| 2015/0177808 A1* | 6/2015 | Sarti | H05K 7/1492 713/300 |
| 2017/0179551 A1* | 6/2017 | Shepard | H01G 11/82 |
| 2017/0338527 A1* | 11/2017 | Walton | H01M 10/6568 |
| 2021/0066767 A1* | 3/2021 | Gao | H01M 50/209 |

* cited by examiner

*Primary Examiner* — Mandeep S Buttar
(74) *Attorney, Agent, or Firm* — WOMBLE BOND DICKINSON (US) LLP

(57) ABSTRACT

A coolant management unit for providing liquid cooling for backup battery unit (BBU) modules of an electronic rack includes a BBU return manifold, a BBU supply manifold, a balance loop, and a power bus. For example, a BBU supply manifold having a rack supply connector to receive cooling fluid from a rack supply manifold and a BBU supply connector to be connected to one of the BBU modules to distribute the cooling fluid. A BBU return manifold to be coupled to a rack return manifold, wherein the BBU return manifold is to receive vapor from the BBU modules. A balance loop connected to each of the BBU modules to establish a fluid connection amongst the BBU modules, such that a level of the cooling fluid in each of the BBU modules remains similar.

20 Claims, 10 Drawing Sheets

RACK BACKUP ENERGY UNIT WITH ADVANCED THERMAL MANAGEMENT SYSTEM

FIELD OF THE INVENTION

Embodiments of the present invention relate generally to the server and rack design, rack power unit, two phase cooling, backup battery. More particularly, embodiments of the invention relate to a rack backup energy unit with advanced thermal management system.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Conventional solutions for rack based server energy units only enable a single backup power function. Furthermore, these existing solutions may not coordinate with high power density rack that are designed with advanced thermal management systems using fluid.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
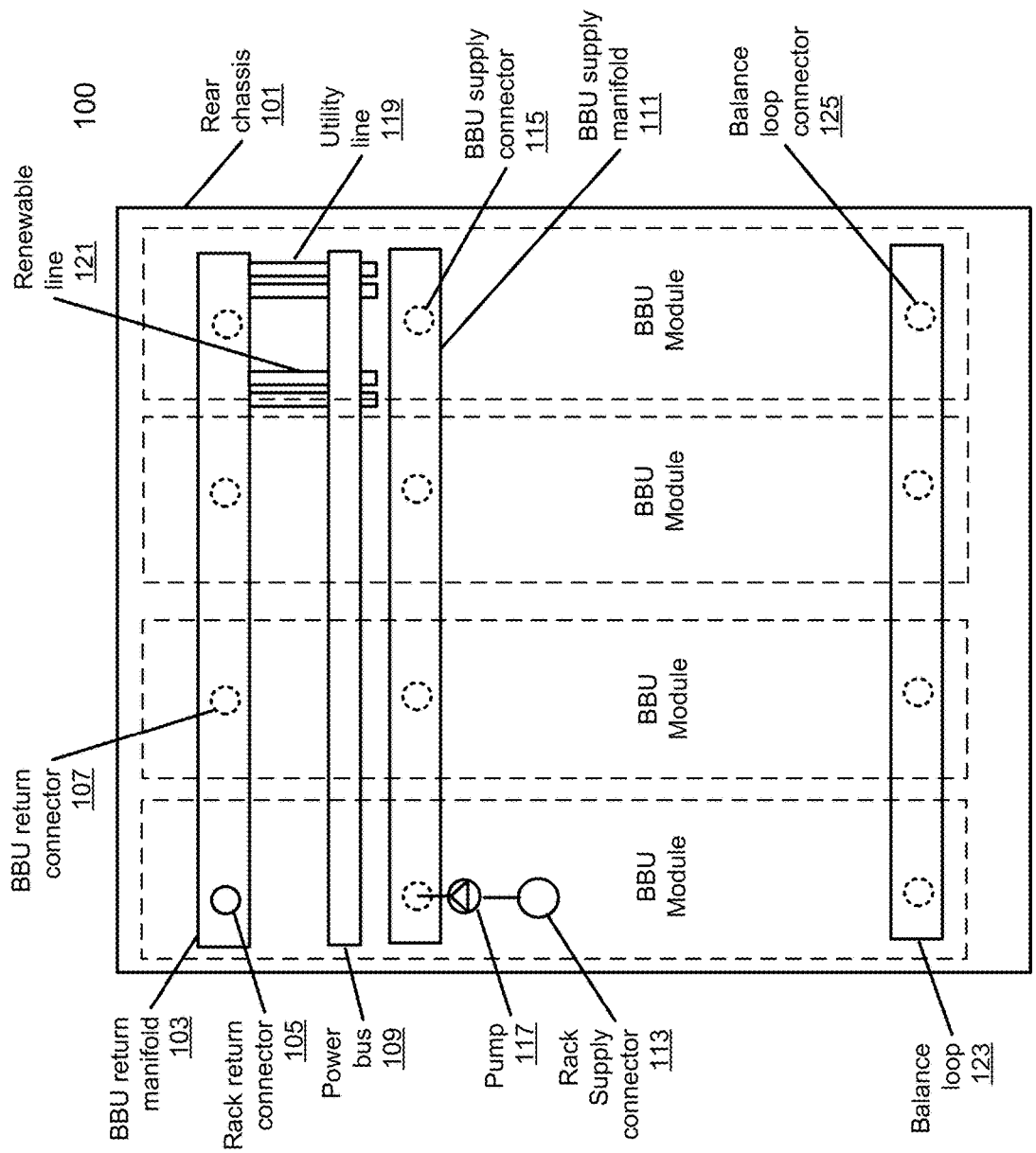
FIG. 1 shows a rear view of an energy unit module with a cooling module according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures.

The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architectures.

The present disclosure aims to propose an advanced energy unit for backup power for modern high power density racks. For example, the design in the present disclosure enables to equipped advanced power delivery design as well as advanced thermal management systems for energy backup battery unit. In addition, the following features and functions are included in the present disclosure: a backup battery unit (BBU) module cooling control fluid level control; a renewable power charging for a backup energy unit; a rack power renewal power input with dedicated busbar; a BBU Shelf design; all modular interfaces; a reconfigurable energy level system; an advanced fluid management and operation system; a design for high power density servers; high efficiency operation and management; a two-phase thermal management for energy unit; a modular design for easy and accommodating configurations; a simplified hardware design for advanced fluid control; and a chassis with internal fluid containment that detects leaks.

The present application relates to an energy unit with advanced thermal management solutions. For example, the entire unit is mainly consisted with a rear module and more than one energy modules. In an embodiment, the rear module and the energy modules are packaged within the chassis. Further, the bottom of the chassis includes a fluid container unit where the leak detection cable is integrated for the entire chassis. Furthermore, the rear module includes a fluid supply inlet and a vapor return line. In addition, a balancing loop is integrated for balancing the fluid among the energy modules, according to an embodiment. In an embodiment, the power bus integrated on the rear module includes a power inlet for both the main power input and the renewable power input. For example, the entire chassis with the rear module as well as several energy modules are integrated with the rack, which connects the rack power system and the fluid interfaces.

According to one aspect, a coolant management unit for providing liquid cooling for backup battery unit (BBU) modules of an electronic rack includes a BBU return manifold, a BBU supply manifold, a balance loop, and a power bus. In an embodiment, a BBU supply manifold includes a rack supply connector to receive cooling fluid from a rack supply manifold and a BBU supply connector to be connected to one of the BBU modules to distribute the cooling fluid. For example, a BBU return manifold is coupled to a rack return manifold, wherein the BBU return manifold is to receive vapor from the BBU modules, wherein the cooling fluid is two-phase cooling fluid to extract heat from the BBU modules and to evaporate the vapor into the BBU return manifold, wherein the vapor is transmitted to an external condenser via the rack return manifold to be condensed back to a liquid form.

Further, a balance loop is connected to each of the BBU modules to establish a fluid connection amongst the BBU modules, such that a level of the cooling fluid in each of the BBU modules remains similar according to an embodiment of the application. For example, coolant management unit comprises a power bus to distribute power to charge the BBU modules or to discharge the BBU modules to provide power to other components of the electronic rack. In an embodiment, the BBU supply manifold has a plurality of BBU supply connectors to be connected to the BBU modules to distribute the cooling fluid to the BBU modules. In some embodiments, the BBU modules comprise a first BBU module and a second BBU module, and the BBU supply manifold is coupled to the first BBU module without being connected with the second BBU module, where the second BBU module is to receive the cooling liquid from the first BBU module via the balance loop. Further, the BBU supply connector is a single connector disposed on the BBU supply manifold to be coupled to the first BBU module according to some embodiments of the application. In addition, in some embodiments, the coolant management unit further comprises a pump disposed between the rack supply connector and the rack supply manifold.

In an embodiment, the BBU supply manifold is positioned below the BBU return manifold. For example, an embodiment, the power bus is positioned below the BBU return manifold and above the BBU supply manifold. Further, the balance loop is positioned below the BBU supply connector according to an embodiment of the application.

In an embodiment, the power bus comprises a first power interface to be coupled to a main power unit of the electronic rack, a second power interface to be coupled to a renewable energy source, and a plurality of power sub-ports, each corresponding to one of the BBU modules. For example, the BBU return manifold comprises a plurality of BBU return connectors to be connected to the BBU modules to receive the vapor from the BBU modules, and a rack return connector to be connected to the rack return manifold to return the vapor to the rack return manifold. Further, the BBU supply manifold further comprises a pump disposed between the rack supply connector and the BBU supply connector according to an embodiment of the application. For example, the pump is controlled to supply the cooling fluid to the BBU modules based on a sensor signal received from at least one of the BBU modules indicating a cooling fluid level.

According to another aspect, a backup battery unit (BBU) chassis of an electronic rack includes a plurality of BBU modules and a coolant management unit. For example, each of the BBU modules have one or more battery cells that are at least partially submerged in cooling fluid. Further, a coolant management unit is mounted on a rear end of the BBU chassis, as described above.

According to a further aspect, an electronic rack includes a plurality of server chassis arranged in a stack, each server chassis to receive one or more server blades; and a plurality of backup battery unit (BBU) chassis coupled to the server chassis to provide backup power to the server chassis. Further, a coolant management unit is mounted on a rear end of the BBU chassis, as described above as described above.

FIG. 1 shows a rear view of coolant management unit 100 (or a cooling module 100) according to an embodiment of the application. In particular, FIG. 1 shows the design of the unit, the rear mode, or rear portion of the chassis 101. For example, the rear side (i.e., rear chassis 101) includes vapor line 103 (i.e., a BBU return manifold) which vapor connectors (e.g., 105 107) are installed. In an embodiment, one side is main connector 105 (i.e., a rack return connector) which will be connecting with a rack return manifold of an electronic rack using a flexible hose, and other side are attached with connectors 107 (i.e., BBU return connectors) for connecting with individual energy units. Connectors 107 are configured to receive vapor from the BBU modules and the vapor is turned to the rack return manifold through rack return connector 105.

In an embodiment, liquid supply 111 (i.e., a BBU supply manifold) is the one for supplying two-phase coolant to the BBU modules. Further, one side is equipped with the main inlet via rack supply connector 113 and the main inlet is assembled with pump 117, and the other side are BBU supply connectors 115 (i.e., a BBU supply connector) connecting with the individual energy modules such as BBU modules. Rack supply connector 113 may be coupled to a rack supply manifold of the electronic rack, for example, via a flexible hose. Alternatively, optional pump 117 may be disposed between rack supply connector 113 and the BBU supply manifold 111 to pump the coolant into the BBU supply manifold 111.

In an embodiment, power distribution 109 (i.e., power bus) which is the main power bus are also attached for connecting the individual energy modules. For example, there are two connectors 119, 121, one for main power bus 119 and the other one is renewable power bus 121.

In one embodiment, rear chassis 101 further includes balancing loop 123 that is connecting all the BBU module through blind mating connectors 125. The balance loop 123 operates as a fluid balancing channel, which is designed for balancing the fluid among all the BBU units integrated to the chassis according an embodiment of the application.

In an embodiment, power bus 109 is assembled between vapor line 103 and liquid line 111. For example, since the individual BBU module is designed in a submerged environment, the power connector packaging on top of the fluid level is a more efficient design.

According to an embodiment of the application, a coolant management unit for providing liquid cooling for backup battery unit (BBU) modules of an electronic rack includes, BBU return manifold 103, BBU supply manifold 111, balance loop 123, and power bus 109. In an embodiment, a BBU supply manifold includes rack supply connector 113 to receive cooling fluid from a rack supply manifold and BBU supply connector 115 to be connected to one of the BBU modules to distribute the cooling fluid. Further, BBU return manifold 103 is coupled to a rack return manifold according to an embodiment of the application. For example, BBU return manifold 103 is to receive vapor from the BBU modules through the respective BBU return connectors. In addition, the cooling fluid is two-phase cooling fluid to extract heat from the BBU modules and to evaporate the vapor into BBU return manifold 103. In an embodiment, the vapor is transmitted to an external condenser via the rack return manifold to be condensed back to a liquid form.

In an embodiment, balance loop 123 is connected to each of the BBU modules to establish a fluid connection amongst the BBU modules, such that a level of the cooling fluid in each of the BBU modules remains similar. The coolant can flow freely amongst the BBU modules via balance loop 123. As a result, the fluid level of each BBU module is maintained substantially the same. The coolant management unit further comprises power bus 109 to distribute power to charge the BBU modules or to discharge the BBU modules to provide power to other components of the electronic rack. Further, the BBU supply manifold 111 has a plurality of BBU supply connectors 115 to be connected to the BBU modules to distribute the cooling fluid to the BBU modules according to an embodiment of the application.

In an embodiment, BBU supply manifold 111 is positioned below BBU return manifold 103. For example, power bus 109 is positioned below BBU return manifold 103 and above BBU supply manifold 111. In addition, balance loop 123 is positioned below BBU supply manifold 111 according to an embodiment of the application.

In an embodiment, power bus 109 comprises a first power interface to be coupled to a main power unit of the electronic rack, a second power interface to be coupled to a renewable energy source such as a solar power source, and a plurality of power sub-ports, each corresponding to one of the BBU modules. BBU return manifold 103 includes a plurality of BBU return connectors 107 to be connected to the BBU modules to receive the vapor from the BBU modules, and rack return connector 105 to be connected to the rack return manifold to return the vapor to rack return manifold 103. In addition, pump 117 is controlled to supply the cooling fluid to the BBU modules based on a sensor signal received from at least one of the BBU modules indicating a cooling fluid level according to an embodiment of the application.

Figure 2:
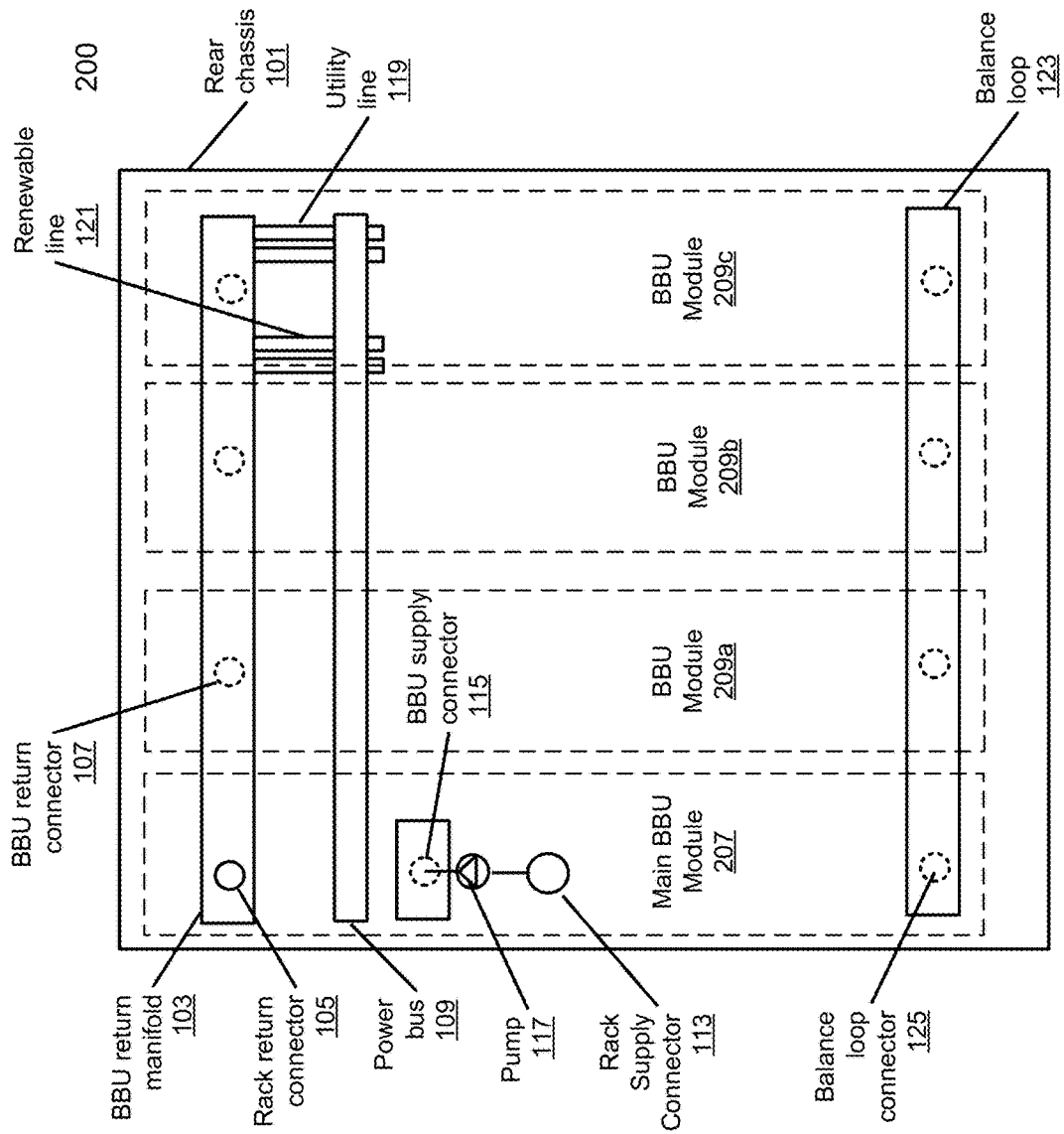
FIG. 2 shows an example of an energy unit module design according to an embodiment of the application.

FIG. 2 shows a rear view of coolant management unit design 200 with a single liquid supply according to an embodiment of the application. In particular, FIG. 2 shows design 200 that the only a single liquid supply inlet port in design 200. In an embodiment, the fluid inlet ports are no longer needed on the individual BBU module (e.g., 209a, 209b, 209c), except one of the BBU module (e.g., BBU module 207). In this example, rack supply connector 113 can be connected to a rack supply manifold via a flexible hose. An optional pump 117 may be disposed between rack supply connector 113 and BBU supply connector 115 of the BBU supply manifold. Rack supply connector 203 may be directly coupled to the rack supply manifold using a flexible hose. The rest of the BBU modules 209a-209c receive the coolant from BBU module 207 via balance loop 123. Thus, the balance loop 123 in this design performs both balancing function and fluid distribution function according to an embodiment of the application. In design 200, the fluid distribution is simplified and less hardware is needed for both the individual BBU module and the coolant management unit.

Furthermore, in some embodiments, the BBU modules (e.g., 207, 209a, 209b, 209c) comprise a first BBU module (e.g., main BBU module 207) and a second BBU module (e.g., 209a, 209b, 209c), and the BBU supply manifold is coupled to the first BBU module (e.g., 207) without being connected with the second BBU module (209a, 209b, 209c). For example, the second BBU module (e.g., 209a, 209b, 209c) receives the cooling liquid from the first BBU module (e.g., 207) via the balance loop (e.g., 123). In addition, BBU supply connector 205 is a single connector disposed on the BBU supply manifold to be coupled to the first BBU module (e.g., 207).

Figure 3:
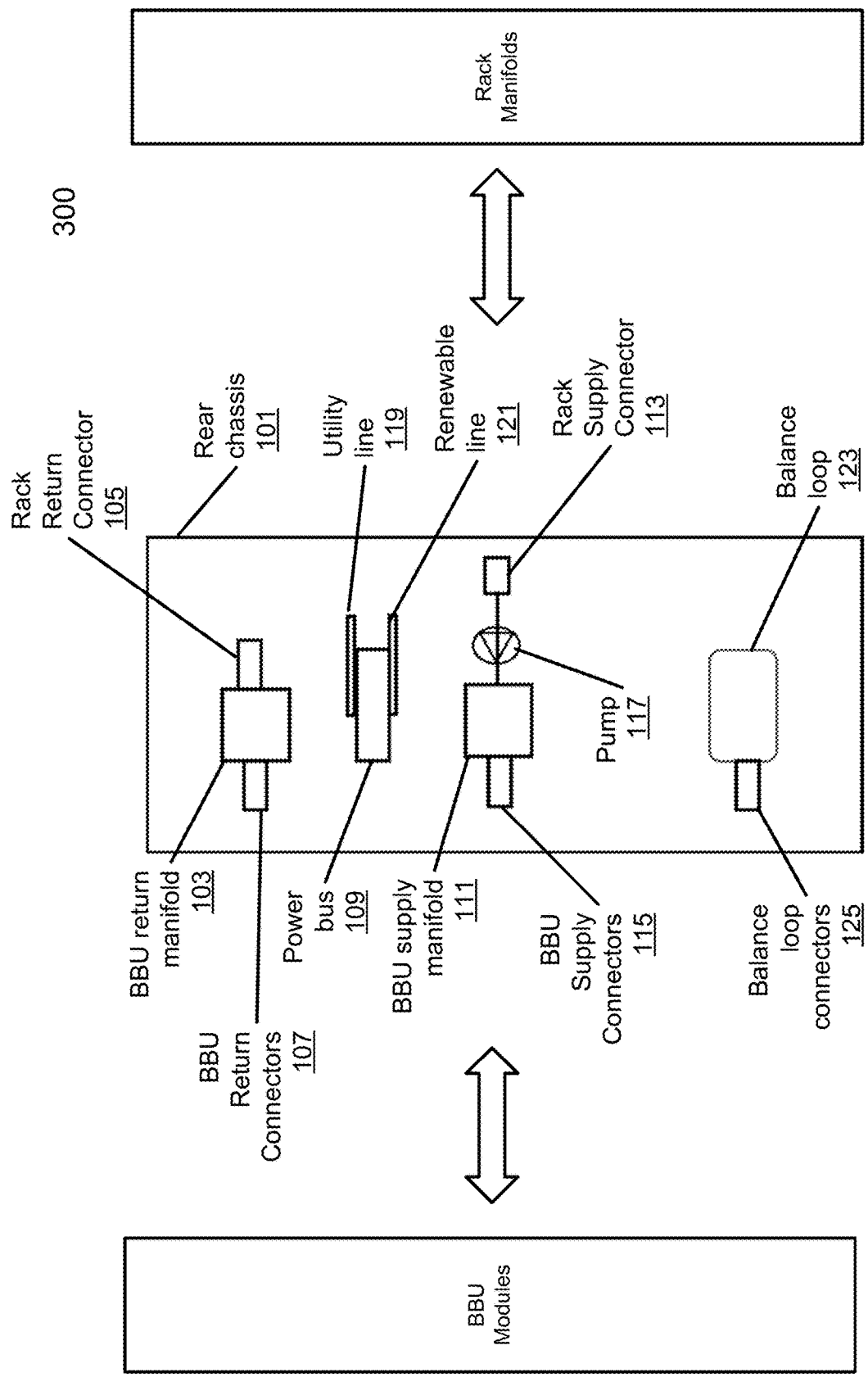
FIG. 3 shows a side view of a rear module according to certain embodiments of the application.

FIG. 3 shows a side view of key components included in the coolant management unit design 300 according to an embodiment of the application. In particular, FIG. 3 shows the rear module connectors and each utility lines. For example, vapor line 103 (i.e., a BBU return manifold) is used for vapor returning, and the left side ones (e.g., BBU return connectors 107, BBU supply connector(s) 115, balance loop connectors 125) are used to connect with the individual BBU modules and the right hand side ones (e.g., rack return connector 105, rack supply connector 113) are used for connecting with the rack manifolds. Further, in FIG. 3, connectors 115 and 117 can be understood as the connectors for engaging with BBU modules according to an embodiment of the application. In an embodiment, the connectors are dripless blind mating connectors.

In an embodiment, power bus 109 is for connecting with rack main bus systems, one for utility power 119 and one for renewable power 121. For example, each individual energy module will be connecting with the bus for charging and discharging.

In an embodiment, liquid supply 111 (i.e., a BBU supply manifold) is equipped with two side connectors as well. For example, the one which shown in FIG. 3 represents design 300 that pump 117 is packaged on rear chassis module 101. In addition, balance loop 123 is assembled with connectors 125 on one side only. It needs to be mentioned that the connectors are blind mating ones according to an embodiment of the application.

In an embodiment, power bus 109 comprises a first power interface to be coupled to a main power unit of the electronic rack, a second power interface to be coupled to a renewable energy source, and a plurality of power sub-ports, each corresponding to one of the BBU modules.

Figure 4:
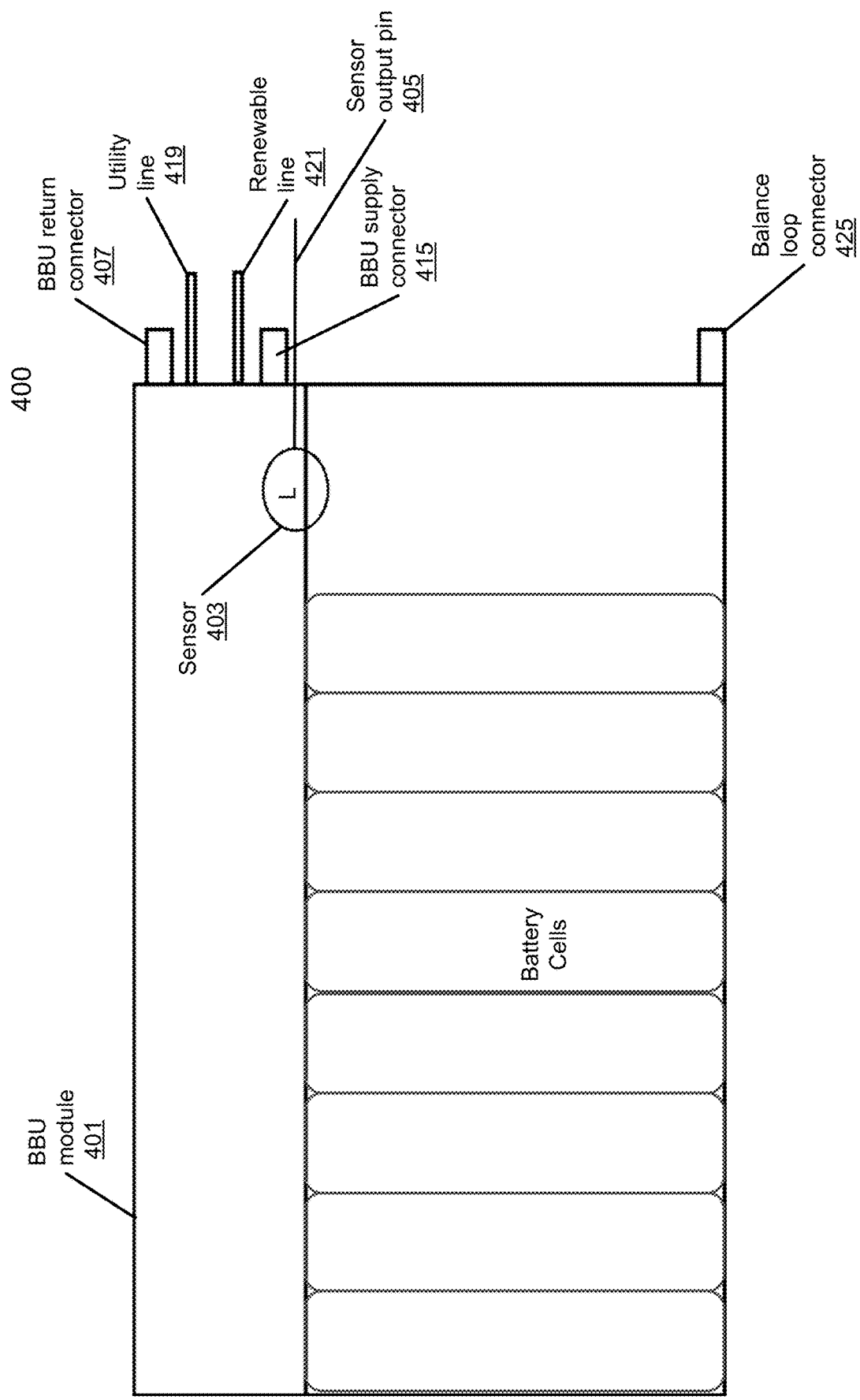
FIG. 4 shows an example of a backup battery unit (BBU) module design according to an embodiment of the application.

FIG. 4 shows an example of a backup battery unit (BBU) module design 400 according to an embodiment of the application. In particular, FIG. 4 shows BBU module design 400 where the lithium-ion cells are packaged internally. For example, design 400 shows the one which can be understood as main module 401 since it includes fluid level sensor 403. In an embodiment, fluid level sensor 403 includes sensor output pin 405 which is used for controlling a pump. It needs to be mentioned that only one module is needed in each of the chassis. In an embodiment, other connectors (e.g., 107, 119, 121, 115) are packaged on the rear side.

For example, power input connectors 419, 421 are packaged on top of liquid connector 415 as well as the designed fluid level within the module. In one embodiment, when BBU module 401 is engaged with rear chassis 101, BBU return connector 407 is connected or mated with a corresponding BBU return connector 107 of the BBU return manifold 103 of the rear chassis. Similarly, utility line 419 is connected with utility line 119 of the rear chassis. Renewable line 421 is connected with renewable line 121 of the rear chassis. BBU supply connector 415 is connected with the corresponding BBU supply connector 115 of the BBU supply manifold 111 on the rear chassis. Balance loop connector 425 can also be connected with the corresponding balance loop connector 125 of balance loop 123 on the rear chassis.

Figure 5:
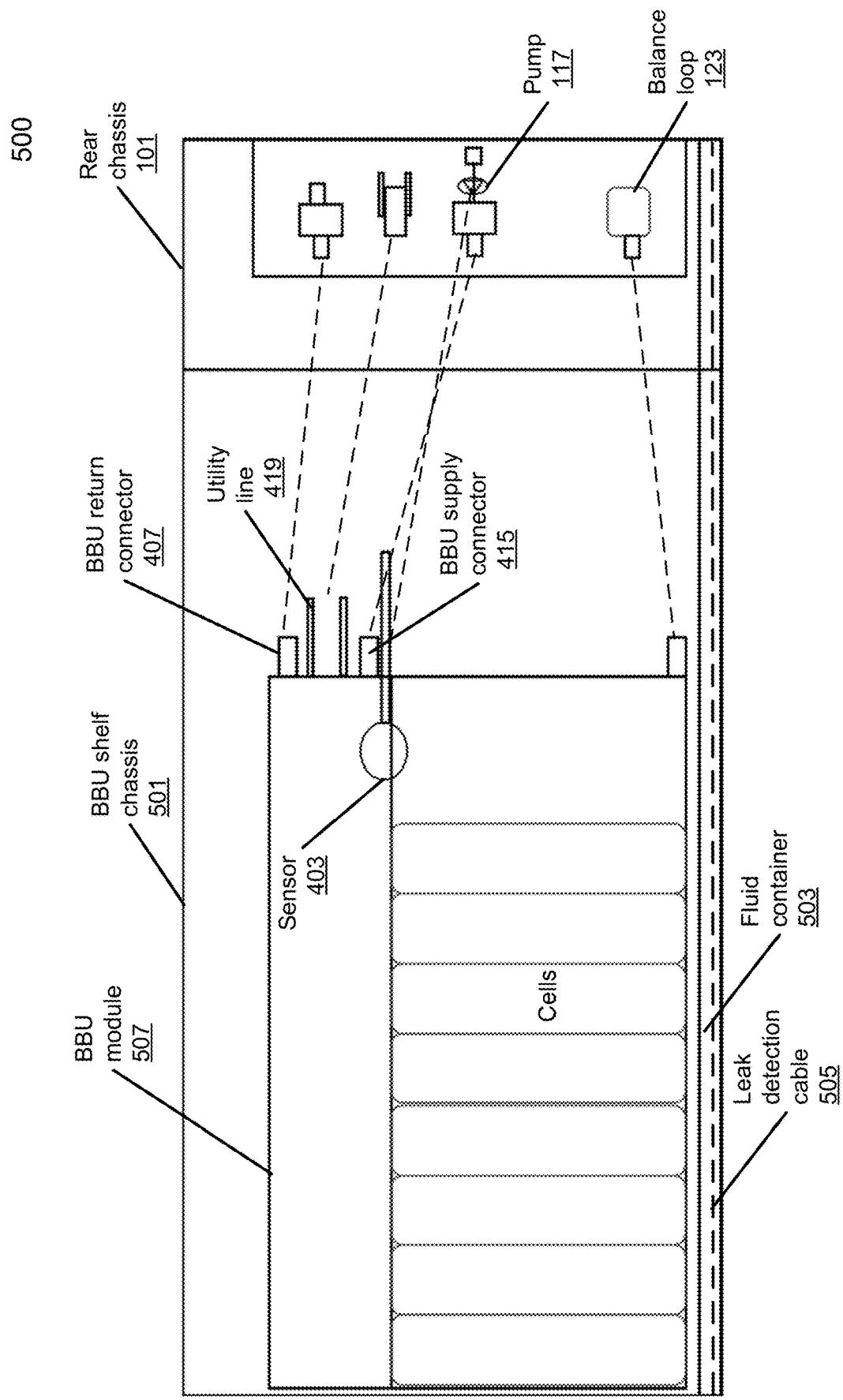
FIG. 5 shows an example of an energy unit shelf chassis according to an embodiment of the application.

FIG. 5 shows a perspective view of a system 500 according to an embodiment of the application. In particular, FIG. 5 shows the integration of BBU shelf chassis 501 in which BBU module 507 and rear chassis module 101 are assembled.

In an embodiment, in FIG. 5, the dash lines represent the mating of the connectors, including liquid 115, vapor 107 and power 119. In addition, it is shows that the only sensor 403 output is used for controlling pump 117 for the entire chassis. For example, current design 500 utilizes balance loop 123 for maintaining the fluid level among all the energy modules.

In an embodiment, another key design is that the bottom of the chassis includes fluid container 503 to contain any potential fluid. For example, leak detection cables 505 are integrated. Further, in this design, other BBU modules not shown in the figure may not include the fluid level sensor. In an embodiment, rear module 101 can be also a module package to BBU shelf chassis 501 and designed separately.

Figure 6:
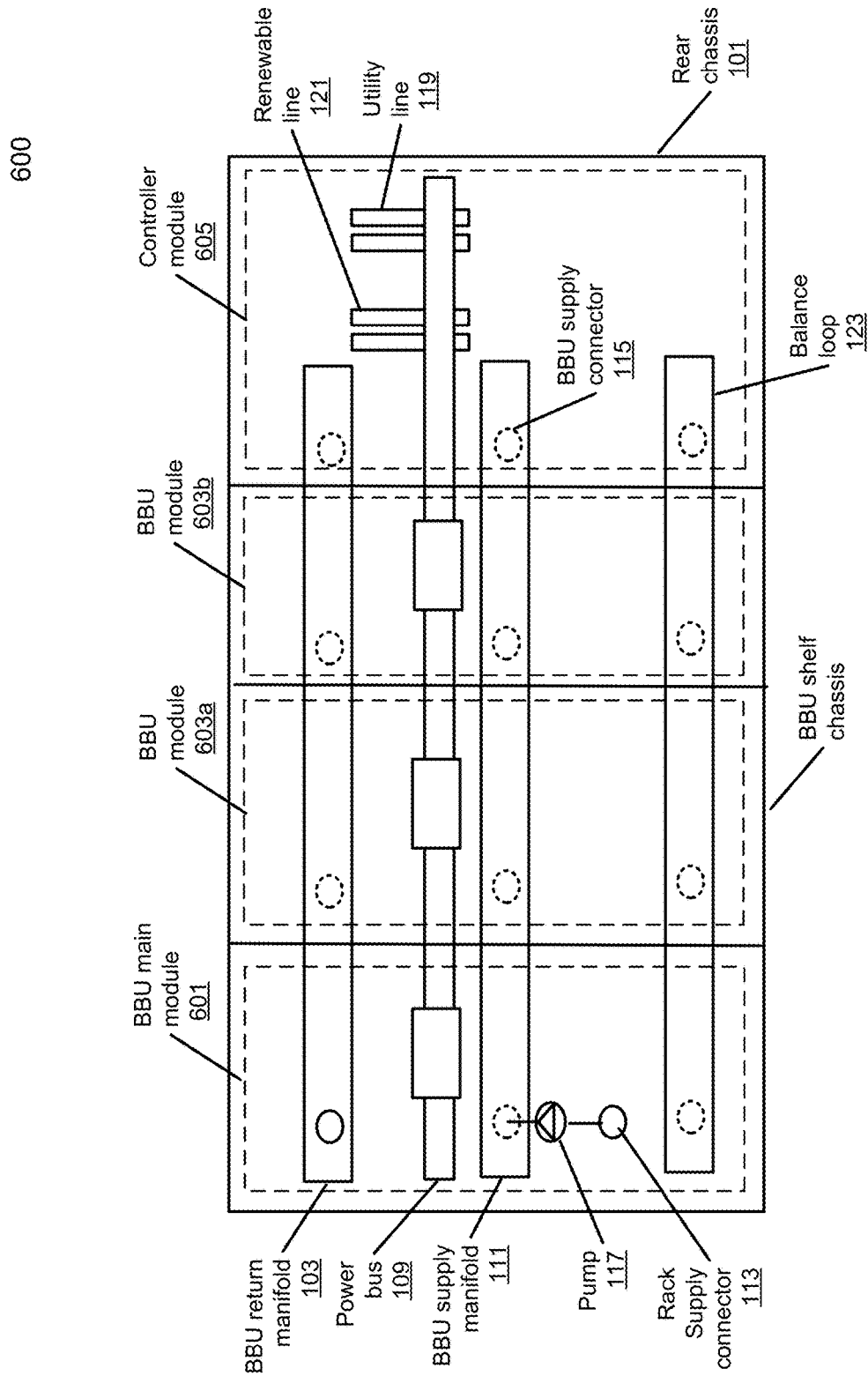
FIG. 6 shows an example of a cooling module in a rear view according an embodiment of the application.

FIG. 6 shows an example of a cooling module assembled in a chassis connected with several BBU modules in a rear view 600 according to an embodiment of the application. In particular, FIG. 6 shows a rear view of the cooling module 600 that several BBU modules (e.g., 601, 603a, 603b) integrated to the chassis and the left hand side one are the main unit 601 which includes the control for pump 117. For example, the right hand side is the one for BBU controller 605. For example, the cooling module 600 includes BBU main module 601 which includes pump 117 disposed between rack supply connector 113 and BBU supply connector 115. Further, the control for pump 117 can adjust the fluid speed in the BBU supply manifold 111 according to an embodiment of the application. In addition, controller module 605 includes power connectors or interfaces 709 according to an embodiment of the application. It should be noted, from example, BBU main module 601, other BBU modules (e.g., 603a, 603b) and controller module 605 all include BBU supply connectors (e.g., 115), which is different from the design in FIG. 7. For example, in FIG. 7, controller module 705 does not include supply connector. In addition, in FIG. 7, connectors and interfaces 709 are designed for different power source lines as shown in FIG. 6 according to an embodiment of the application.

In an embodiment, a coolant management unit for providing liquid cooling for BBU modules of an electronic rack includes BBU return manifold 103, BBU supply manifold 111, balance loop 123, and power bus 109.

In an embodiment, a BBU return manifold 103 to be coupled to a rack return manifold. For example, BBU return manifold 103 is to receive vapor from the BBU modules, and the cooling fluid is two-phase cooling fluid to extract heat from the BBU modules and to evaporate the vapor into BBU return manifold 103. In addition, the vapor is transmitted to an external condenser via the rack return manifold to be condensed back to a liquid form.

According to an embodiment of the application, balance loop 123 is connected to each of the BBU modules to establish a fluid connection amongst the BBU modules, such that a level of the cooling fluid in each of the BBU modules remains similar. For example, coolant management unit further comprises power bus 109 to distribute power to charge the BBU modules or to discharge the BBU modules to provide power to other components of the electronic rack.

According to an embodiment of the application, BBU supply manifold 111 is positioned below BBU return manifold 103. In an embodiment, power bus 109 is positioned below BBU return manifold 103 and above BBU supply manifold 111. For example, balance loop 123 is positioned below BBU supply manifold 111.

Figure 7:
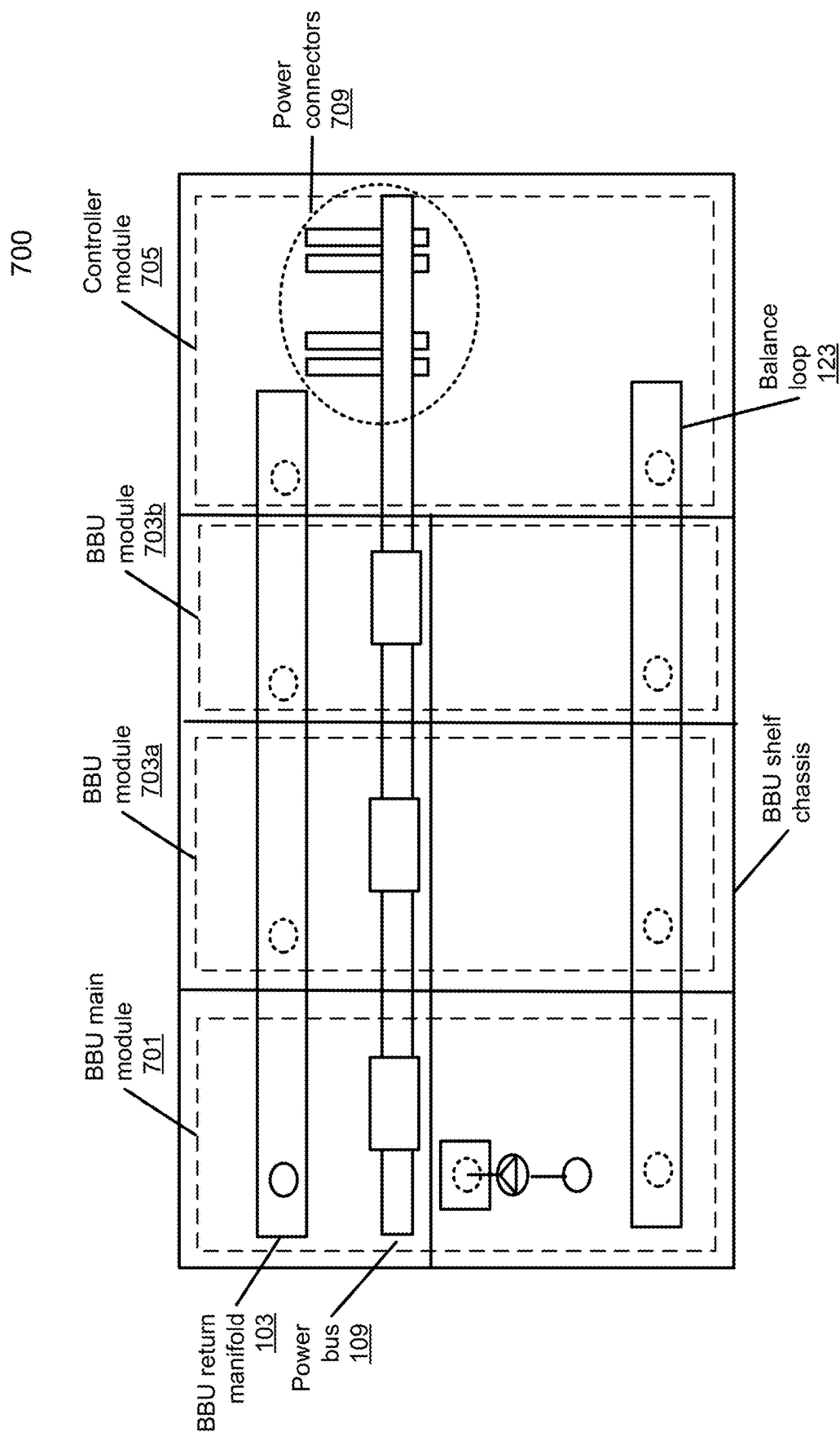
FIG. 7 shows another example of a cooling module in a rear view according to an embodiment of the application.

FIG. 7 shows another example of a cooling module in a rear view 700 according to an embodiment of the application. In particular, FIG. 7 shows a rear view of the cooling module 700 that the energy chassis is designed with single fluid inlet port 707 for connecting with main BBU module 701. In one embodiment, the controller can be packaged at different spaces.

According to an embodiment of the application, in FIG. 7, the system includes a coolant management unit for providing liquid cooling for backup battery unit (BBU) modules of an electronic rack which includes BBU return manifold 103, a single fluid inlet port, balance loop 123, and power bus 109.

In an embodiment, in FIG. 7, the design includes a single fluid inlet port 707 with rack supply connector 113 to receive cooling fluid from a rack supply manifold. For example, in this design, there is no BBU supply connectors (e.g., BBU supply connector 115 in FIG. 6) to be connected to other BBU modules to distribute the cooling fluid, which is different from the design in FIG. 6.

For example, the cooling module 700 includes BBU main module 701 which includes pump 117 disposed between rack supply connector 113 and BBU supply connector 115. Further, the control for pump 117 can adjust the fluid speed in the BBU supply manifold according to an embodiment of the application. In addition, controller module 705 includes renewable power line 121 and utility power line 119 according to an embodiment of the application. It should be noted, from example, only BBU main module 601 includes single fluid inlet port 707 with rack supply connector 113. However, other BBU modules (e.g., 703a, 703b) and controller module 705 do not include BBU supply connectors (e.g., 115 in FIG. 6), which is different from the design in FIG. 6. In an embodiment, controller module 705 is not designed using the two-phase cooling, so it does not include a fluid connector.

According an embodiment of the application, BBU return manifold 103 is to be coupled to a rack return manifold, and the BBU return manifold 103 is to receive vapor from the BBU modules. Further, for example, the cooling fluid is two-phase cooling fluid to extract heat from the BBU modules and to evaporate the vapor into BBU return manifold 103, and the vapor is transmitted to an external condenser via the rack return manifold to be condensed back to a liquid form.

In an embodiment, similar to above, balance loop 123 is connected to each of the BBU modules to establish a fluid connection amongst the BBU modules, such that a level of the cooling fluid in each of the BBU modules remains similar. According to an embodiment of the application, power bus 109 to distribute power to charge the BBU modules or to discharge the BBU modules to provide power to other components of the electronic rack.

In an embodiment, single fluid inlet port 707 is positioned below the BBU return manifold 103. For example, power bus 109 is positioned below BBU return manifold 103 and above single fluid inlet port 707. In addition, balance loop 123 is positioned below single fluid inlet port 707 according to an embodiment of the application.

Figure 8:
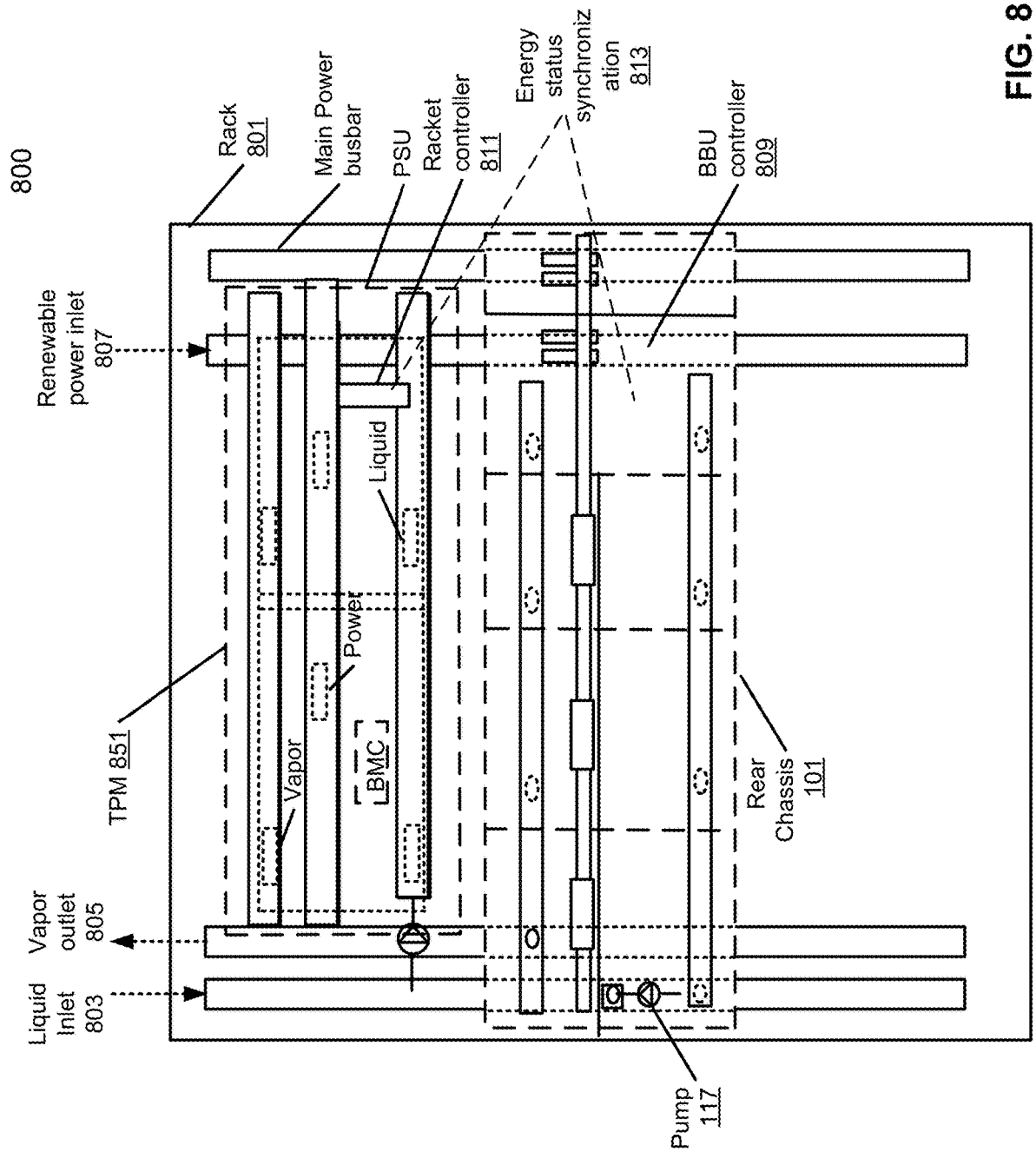
FIG. 8 shows an example of a rack architecture design according to an embodiment of the application.

FIG. 8 shows the rack architecture 800 using the energy unit. For example, rack 801 includes liquid inlet 803 and vapor return 805. In addition, the key design is that rack 801 includes a renewable power bus with a dedicated renewable power input 807 from system. In an embodiment, the individual energy chassis are connected to these fluid sources and power sources. For example, the renewable power bus is dedicated for the energy chassis.

In an embodiment, FIG. 8 shows that the servers are blading system which are also cooled using two-phase coolant. For example, the BBU chassis includes the rear module and several BBU module including one main BBU module. In an embodiment, pump 117 is controlled by a fluid sensor. Further, the BBU controller 809 communicates with the rack controller 811 for energy status synchronization 813. In an embodiment, both two controllers connecting and communicating with the rack switch through TCP/IP protocol. For example, the individual BBU module which can be reconfigurable are upgraded for different applications. In addition, the renewable power such as generated by the facility photovoltaics (PV) system are stored in the energy unit before powering the server and other IT equipment. In an embodiment, the thermal management of the individual energy unit ensures the fluid level within all the BBU modules all the time.

Similar to rear chassis 101, a two-phase module (TPM) 851 may be utilized to connect a server chassis to the rack manifolds and rack power lines. A TPM module may include a server supply manifold to supply two-phase coolant from a rack supply manifold to the servers. The TPM module may further include a server return manifold to receive vapor from the servers. The vapor is then returned to a rack return manifold.

Figure 9:
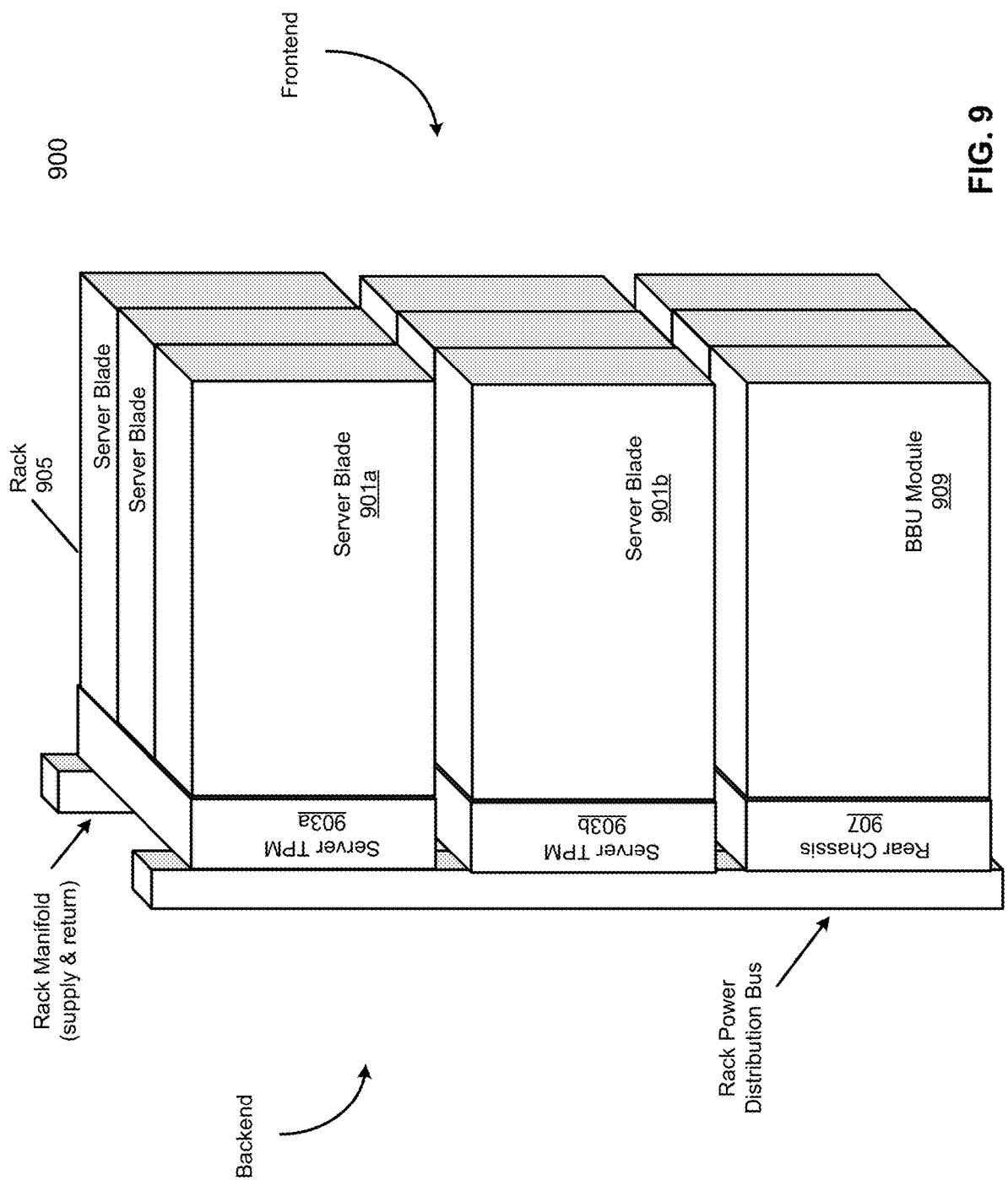
FIG. 9 shows a perspective view of an electronic rack according to an embodiment of the application.

FIG. 9 shows a perspective view of a system 900 according to an embodiment of the application. In particular, FIG. 9 shows that a rack 905 is populated with several groups of blade servers (901*a*, 901*b*) and BBU module 909 connected with their respective server TPMs (903*a*, 903*b*) and rear chassis 907. In an embodiment, each group of blade servers (901*a*, 901*b*)/BBU module 909 is functioning with a respective TPM 903/rear chassis 907. In an embodiment, the rack mounted fluid liquid supply and main return are added to the rear side of the racks once the server TPMs (903*a*, 903*b*) and rear chassis 907 are populated. In an embodiment, the detailed operation may enable the blade servers (901*a*, 901*b*)/BBU module 909 to be installed and uninstalled from the rack without any impact on other systems.

In addition, a TPM 903/rear chassis 907 can be individually installed and uninstalled without any impact on the rack liquid supply and main return, since the connections are through flexible hoses. In an embodiment, the design enables an efficient control strategy on the fluid system since each of the individual TPM 903 and rear chassis 907 is separately controlled. In an embodiment, even though multiple TPMs 903 and rear chassis 907 are sharing the rack liquid supply and main return manifolds, the individual controller (not shown) as well as the corresponding sensors input allows a robust localized control for groups of blade servers.

Figure 10:
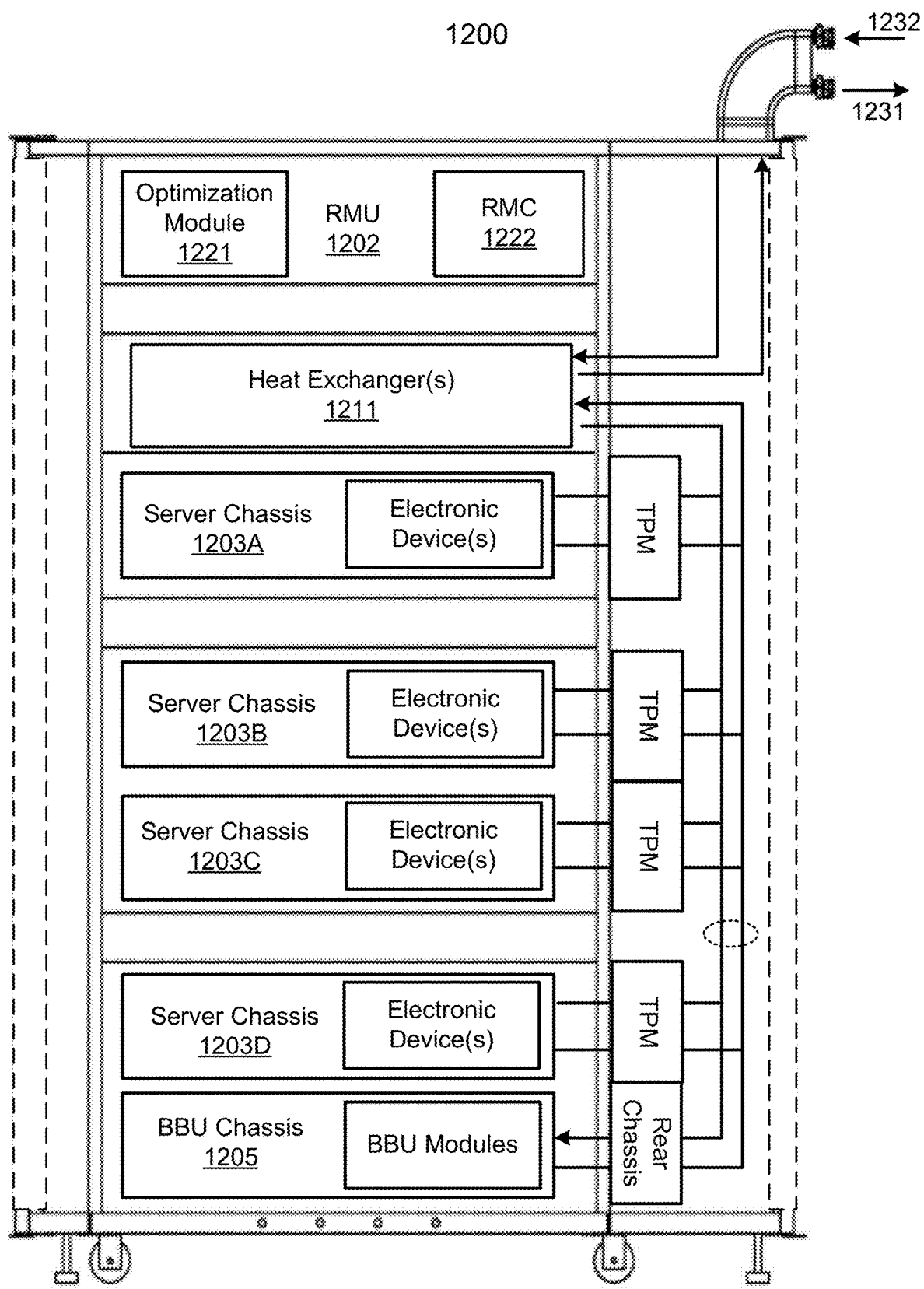
FIG. 10 is a block diagram illustrating an example of an electronic rack according to one embodiment.

FIG. 10 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, BBU shelf 1205 and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Each server chassis may include one or more blade slots to receive one or more server blades/BBU module. Each server blade represents one or more servers therein. For each of the server chassis, a rear chassis module/server TPM is mounted in the rear end of the rack. When a server blade/BBU module is inserted from the frontend, the liquid/vapor connectors and the power connector of the server blade/BBU module can connect with the corresponding TPM/rear chassis module. The TPM/rear chassis module may be coupled to the rack manifold, for example, via flexible hoses, as described above.

Note that although there are four server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backend of server chassis 1203 or on the electronic rack to generate airflows flowing from frontend 1204, traveling through the air space of the server chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate. The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the server chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A coolant management unit for providing liquid cooling for backup battery unit (BBU) modules of an electronic rack, the coolant management unit comprising:
   a BBU supply manifold including a rack supply connector to receive cooling fluid from a rack supply manifold and a BBU supply connector to be connected to one of the BBU modules to distribute the cooling fluid;
   a BBU return manifold to be coupled to a rack return manifold, wherein the BBU return manifold is to receive vapor from the BBU modules, wherein the cooling fluid is two-phase cooling fluid to extract heat from the BBU modules and to evaporate into the vapor into the BBU return manifold, wherein the vapor is transmitted to an external condenser via the rack return manifold to be condensed back to a liquid form; and a balance loop connected to each of the BBU modules to establish a fluid connection amongst the BBU modules, such that a level of the cooling fluid in each of the BBU modules remains similar.

2. The coolant management unit of claim 1, further comprising a power bus to distribute power to charge or to discharge the BBU modules for other components of the electronic rack, wherein the power bus comprises:
 a first power interface to be coupled to a main power unit of the electronic rack;
 a second power interface to be coupled to a renewable energy source; and
 a plurality of power sub-slots, each corresponding to one of the BBU modules.

3. The coolant management unit of claim 2, wherein the BBU supply manifold comprises the plurality of BBU supply connectors to be connected to the BBU modules to distribute the cooling fluid to the BBU modules, and wherein a rack supply connector is to be connected to the rack supply manifold.

4. The coolant management unit of claim 1, wherein the BBU supply manifold is positioned below the BBU return manifold.

5. The coolant management unit of claim 2, wherein the power bus is positioned below the BBU return manifold and above the BBU supply manifold.

6. The coolant management unit of claim 1, wherein the balance loop is positioned at the bottom of the coolant management unit underneath the BBU supply manifold.

7. The coolant management unit of claim 1, wherein the BBU modules comprise a first BBU module and a second BBU module, wherein the BBU supply manifold is coupled to the first BBU module without being connected with the second BBU module, wherein the second BBU module receives the cooling fluid from the first BBU module via the balance loop.

8. The coolant management unit of claim 1, wherein the BBU return manifold comprises:
 a plurality of BBU return connectors to be connected to the BBU modules to receive the vapor from the BBU modules; and
 a rack return connector to be connected to the rack return manifold to return the vapor to the rack return manifold.

9. The coolant management unit of claim 1, wherein the BBU supply manifold further comprises a pump disposed between the rack supply connector and the BBU supply connector, wherein the pump is directly assembled a single supply connector, to connect with the rack supply manifold.

10. The coolant management unit of claim 9, wherein the pump is controlled to supply the cooling fluid to the BBU modules based on a sensor signal received from at least one of the BBU modules indicating a cooling fluid level.

11. A backup battery unit (BBU) chassis of an electronic rack, comprising:
 a plurality of BBU modules, each of the BBU modules having one or more battery cells that are at least partially submerged in cooling fluid; and
 a coolant management unit mounted on a rear end of the BBU chassis, wherein the coolant management unit comprises:
  a BBU supply manifold having a rack supply connector to receive the cooling fluid from a rack supply manifold and a BBU supply connector to be connected to one of the BBU modules to distribute the cooling fluid,
  a BBU return manifold to be coupled to a rack return manifold, wherein the BBU return manifold is to receive vapor from the BBU modules, wherein the cooling fluid is two-phase cooling fluid to extract heat from the BBU modules and to evaporate into the vapor into the BBU return manifold, wherein the vapor is transmitted to an external condenser via the rack return manifold to be condensed back to a liquid form, and
  a balance loop connected to each of the BBU modules to establish a fluid connection amongst the BBU modules, such that a level of the cooling fluid in each of the BBU modules remains similar.

12. The BBU chassis of claim 11, wherein the coolant management unit further comprises a power bus to distribute power to charge or to discharge the BBU modules for other components of the electronic rack, wherein the power bus comprises:
 a first power interface to be coupled to a main power unit of the electronic rack;
 a second power interface to be coupled to a renewable energy source; and
 a plurality of power sub-slots, each corresponding to one of the BBU modules.

13. The BBU chassis of claim 12, wherein the BBU supply manifold comprises the plurality of BBU supply connectors to be connected to the BBU modules to distribute the cooling fluid to the BBU modules, and wherein a rack supply connector is to be connected to the rack supply manifold.

14. The BBU chassis of claim 11, wherein the BBU supply manifold is positioned below the BBU return manifold.

15. The BBU chassis of claim 12, wherein the power bus is positioned below the BBU return manifold and above the BBU supply manifold.

16. The BBU chassis of claim 11, wherein the balance loop is positioned at the bottom of the coolant management unit underneath the BBU supply manifold.

17. The BBU chassis of claim 11, wherein the BBU modules comprise a first BBU module and a second BBU module, wherein the BBU supply manifold is coupled to the first BBU module without being connected with the second BBU module, wherein the second BBU module receives the cooling fluid from the first BBU module via the balance loop.

18. The BBU chassis of claim 11, wherein the BBU return manifold comprises:
 a plurality of BBU return connectors to be connected to the BBU modules to receive the vapor from the BBU modules; and
 a rack return connector to be connected to the rack return manifold to return the vapor to the rack return manifold.

19. An electronic rack, comprising:
 a plurality of server chassis arranged in a stack, each server chassis containing one or more servers; and
 a backup battery unit (BBU) chassis coupled to the server chassis to provide backup power to the server chassis, wherein the BBU chassis comprises:
  a plurality of BBU modules, each of the BBU modules having one or more battery cells that are at least partially submerged in cooling fluid; and
  a coolant management unit mounted on a rear end of the BBU chassis, wherein the coolant management unit comprises:

a BBU supply manifold having a rack supply connector to receive the cooling fluid from a rack supply manifold and a BBU supply connector to be connected to one of the BBU modules to distribute the cooling fluid, a BBU return manifold to be coupled to a rack return manifold, wherein the BBU return manifold is to receive vapor from the BBU modules, wherein the cooling fluid is two-phase cooling fluid to extract heat from the BBU modules and to evaporate into the vapor into the BBU return manifold, wherein the vapor is transmitted to an external condenser via the rack return manifold to be condensed back to a liquid form, and a balance loop connected to each of the BBU modules to establish a fluid connection amongst the BBU modules, such that a level of the cooling fluid in each of the BBU modules remains similar.

20. The electronic rack of claim 19, wherein the coolant management unit further comprises a power bus to distribute power to charge the BBU modules or to discharge the BBU modules to provide power to other components of the electronic rack.

* * * * *